United States Patent [19]

Kraus

[11] Patent Number: 5,434,353
[45] Date of Patent: Jul. 18, 1995

[54] SELF-SUPPORTING INSULATED CONDUCTOR ARRANGEMENT SUITABLE FOR ARRANGEMENT IN A VACUUM CONTAINER

[75] Inventor: Werner Kraus, Garching, Germany

[73] Assignee: Max-Planck-Gesellschaft zur Foerderung der Wissenschaften e.v. Berlin, Munich, Germany

[21] Appl. No.: 166,502

[22] Filed: Dec. 13, 1993

[30] Foreign Application Priority Data

Dec. 11, 1992 [DE] Germany .................. 42 41 927.1

[51] Int. Cl.[6] .................. H01B 7/34; H01J 7/24
[52] U.S. Cl. .................. 174/15.6; 174/24; 174/68.3; 174/99 R; 174/110 R; 315/111.81
[58] Field of Search .............. 174/15.1, 15.6, 110 R, 174/110 A, 99 R, 68.1, 68.3, 24; 315/111.81

[56] References Cited

U.S. PATENT DOCUMENTS

| | | | |
|---|---|---|---|
| 3,856,979 | 12/1974 | Schmid | 174/15.6 |
| 3,962,530 | 6/1976 | Jones | 174/15.6 |
| 4,479,029 | 10/1984 | Banov et al. | 174/15.6 |
| 4,729,424 | 3/1988 | Mizuno et al. | 174/15.1 |
| 4,731,134 | 3/1988 | Alloin et al. | 174/15.6 |
| 4,849,675 | 7/1989 | Muller | 315/111.51 |
| 4,912,446 | 3/1990 | Singh et al. | 174/15.6 |
| 5,017,835 | 5/1991 | Oechsner | 315/111.81 |
| 5,036,252 | 7/1991 | Lob | 315/111.31 |
| 5,049,840 | 9/1991 | Gesche et al. | 333/32 |
| 5,078,823 | 1/1992 | Chollet et al. | 156/345 |
| 5,136,856 | 8/1992 | Yamamoto et al. | 174/15.1 |
| 5,173,146 | 12/1992 | Ito et al. | 156/345 |
| 5,180,949 | 1/1993 | Durr | 315/111.51 |

FOREIGN PATENT DOCUMENTS

| | | |
|---|---|---|
| 0102569 | 3/1984 | European Pat. Off. . |
| 3011686 | 10/1980 | Germany . |
| 887029 | 1/1962 | United Kingdom ...... 174/15.6 |

OTHER PUBLICATIONS

"Development of Radio Frequency Induction Plasma Generators for Neutral Beams", by W. F. DiVergillo, et al., American Institute of Physics, Rev.Sci.Instrum. 57(7), Jul. 1986.

"Performance Characteristics of a Capacitively Coupled 3 cm rf ion Source", by D. Korzec, et al., American Institute of Physics, Rev.Sci.Instrum. 63(5), May 1992.

Primary Examiner—Morris H. Nimmo
Attorney, Agent, or Firm—Helfgott & Karas

[57] ABSTRACT

A self-supporting electric conductor arrangement, in particular a coil, suitable for arrangement in a vacuum container, contains, as a supporting structure, a tube (18a) of insulating material, e.g. quartz glass, in which is arranged an electric conductor (18b) in the form of a flexible chord or an electrically conducting layer precipitated on the inner wall of the tube. A preferred field of application is a coil-shaped insulated antenna situated in the plasma for a high frequency plasma generator.

7 Claims, 1 Drawing Sheet

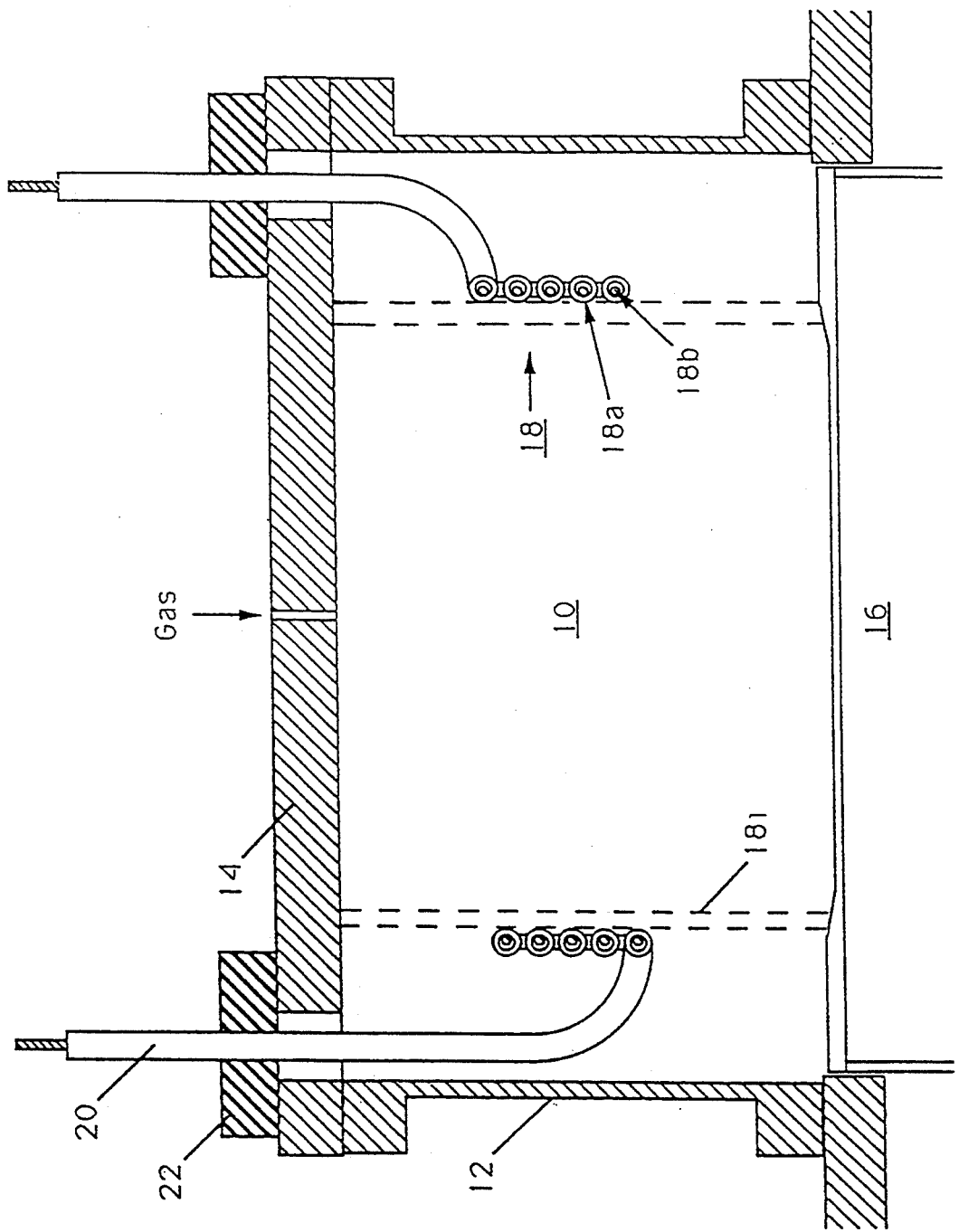

SELF-SUPPORTING INSULATED CONDUCTOR ARRANGEMENT SUITABLE FOR ARRANGEMENT IN A VACUUM CONTAINER

FIELD OF THE INVENTION

The present invention concerns a self-supporting insulated conductor arrangement suitable for arrangement in a vacuum container and, in particular, as an insulated antenna situated in the plasma for a high frequency plasma generator. The term "conductor arrangement" shall include electric coils, electrodes and so forth.

DESCRIPTION OF THE RELATED ART

In high frequency ion sources according to the state of the art, in which a plasma discharge in a discharge chamber filled with gas at reduced pressure is produced by an electric coil supplied at high frequency, the coil, which serves as a high frequency antenna, can be situated either outside or inside the discharge container.

In the former case, the walls of the discharge container must be made of insulating material, e.g. quartz glass, so that the high frequency power can be input into the discharge volume and so that eddy current losses in the walls are avoided. Large discharge containers, in particular those with a non-circular cross section, must usually be arranged in a vacuum tank in order to avoid an excessive loading of the wall of the discharge container by the air pressure.

In the second case, the problem consists in insulating the windings of the coil, which forms the high frequency antenna and which must be self-supporting, sufficiently from the plasma produced in order to prevent arc discharges between the windings, the connections of the coil and at the wall entrances of the discharge container, since such arc discharges lead to a pollution of the plasma and to the destruction of the coil. The insulation must be able to resist the chemically aggressive plasma species and the high thermal loading by the plasma. Crack formation or flaking off, which occur easily when the thermal expansion coefficients and the elasticity of the coil conductor and of the insulation differ considerably from each other, must not be allowed to occur.

It is known to use water-cooled coils of metal tubing, generally of copper, which are insulated with several layers of glass fibre or quartz fibre weave and shrink-fit tubes or by enamelling. A solution suitable also for longer operating times, which, for higher powered plasma generators in nuclear fusion technology and so forth, means more than about 5 seconds, has not yet been found. The electric insulation can, in general, withstand only short pulses and a further disadvantage exists in that there is almost no thermal contact between the cooled tubular coil conductor and the insulation and also in that the surface area and thus the gas evolution rate as well as the erosion surface are very large.

SUMMARY OF THE INVENTION

The object of the present invention is, accordingly, to provide a self-supporting electrically insulated coil or other conductor or electrode arrangement which is suitable for arrangement in a vacuum container and which can withstand high thermal loading as well as attack by surrounding plasma.

According to the present invention, a self-supporting insulated electric conductor arrangement suitable for arrangement in a vacuum container, e.g. in the form of a coil or a capacitive electrode, having an electric conductor and an insulation surrounding this is characterised in that the insulation consists of a tube structure of insulating material, such as quartz glass, which represents the supporting structure of the conductor arrangement and which contains the electric conductor.

The conductor can have, for example, the form of a flexible chord or an electrically conducting layer precipitated on the inside of the tube.

Compared with the insulated conductor arrangements until now, the subject of the invention has a number of advantages, in particular a better and more resistant electric insulation; the absence of mechanical stresses between the electric conductor and the insulation; the possibility of direct cooling of the insulation and of the conductor by passing gas or liquid through the tube structure, the cross section of which is not entirely filled by the conductor. By this means better thermal characteristics are obtained, in particular for longer operating times. In comparison with a coil arranged outside the discharge container, the cost of the apparatus and the space requirement are lower and the wall of the discharge container is subjected to no restrictions regarding material and design.

Preferred fields of application of the invention are high frequency antennae for high frequency plasma generators in plasma technology, high power high frequency ion sources for the production of positive or negative ions as well as high frequency plasma neutralisers for the neutral injection in nuclear fusion plants.

BRIEF DESCRIPTION OF THE DRAWING

In the following, the invention will be explained in more detail by means of an example of an embodiment with reference to the drawing, the only FIGURE of which shows, in section, a discharge chamber arrangement of a high frequency plasma generator which contains an insulated coil-shaped high frequency antenna according to an embodiment of the invention.

DESCRIPTION OF THE PREFERRED EMBODIMENT

The discharge chamber arrangement shown in FIG. 1 has a discharge chamber 10, which is bounded by a metal side wall 12 and a lid 14. On the side opposite the lid 14, the discharge chamber opens onto an accelerator system 16. A high frequency antenna in the form of a one-layer insulated coil 18 is arranged in the discharge chamber 10. The coil is connected with a high frequency generator, not illustrated, by supply leads 20. In practice, a vacuum system (not illustrated) is also connected to the accelerator system 16. In addition, the lid 14 is equipped with an arrangement, indicated only schematically, for the introduction of gas, which is ionised by the field produced by the high frequency antenna.

A fundamental problem in an arrangement of this type exists, as was already mentioned, in equipping the coil 18 with an insulation which can withstand the thermal loading from the plasma and the chemical attack by the ions and neutral particles of the plasma. Until now, as mentioned, water-cooled coils of copper pipe have been used, which were insulated with several layers of glass fibre or quartz weave and shrink-fit tubes or by enamelling. These known insulations have proven to be unusable. Thus, as indicated by the broken line, coils have also been arranged outside the discharge chamber, its wall 18i having been manufactured from insulating material, such as quartz glass. Since the discharge chamber is, in general, not cylindrical but long and flat, there is a danger here that the discharge chamber side wall 18i made of insulating material will not stand up to the atmospheric pressure. It was therefore necessary to provide an additional vacuum tank to relieve the insulating material wall 18i from the atmospheric pressure. It is clear that, by this means, either the total dimensions must be increased or the discharge chamber must be made smaller.

The present invention makes it possible to solve the problems regarding the resistance of the insulation of a coil or other conductor or electrode arrangement arranged in a plasma discharge chamber so that the wall of the discharge chamber can be manufactured from any mechanically resistant material, such as metal, and no additional space consuming vacuum tank is required for pressure relief.

The solution of the problem consists in that the supporting structure of the coil (or other electrode arrangement) is not, as, until now, was the case for a coil arranged in the discharge chamber, a metal tube but a tube 18a of a suitable insulating material, e.g. quartz glass, which forms the coil insulation. Since tubes have a high compressive strength in virtue of their configuration alone and insulating materials having a high compressive strength, such as quartz glass, hard glass, oxide ceramics and various other types of ceramics, are available, the insulating tube 18a can have a relatively low wall thickness.

The electric conductor 18b forming the actual coil is located inside the insulating tube 18a and can comprise a flexible chord of metal wire or a conducting layer precipitated, e.g. electrochemically, on the inner wall of the insulating tube 18a.

The supply leads 20 of the coil 18 are led out of the discharge chamber through wall entrances 22. Since the coil conductor is insulated by the insulating tube, the wall entrances need not include electric insulation.

The interior of the insulating tube 18a can be at atmospheric pressure or even at excess pressure.

In the embodiment illustrated, neighbouring tube windings are joined together, e.g. melted together, in order to increase the mechanical stability.

If the conductor 18b does not entirely fill the cross section of the tube 18a, which will generally be the case, the insulating tube and the conductor can be cooled directly by a coolant supplied through the tube.

The present invention is not restricted to the embodiment example described, rather other self-supporting conductor or electrode structures can also be formed in the manner of the invention, e.g. coils of other configuration or also comb-shaped or serpentine-shaped or grid-shaped capacitive electrodes ("electrode plates"), for example.

We claim:

1. High frequency antenna of a high frequency plasma generator, comprising a self-supporting insulated electric conductor arrangement, having an electric conductor and an insulation surrounding said conductor, whereby the insulation comprises a tube structure of insulating material, which represents the supporting structure of the conductor arrangement and contains the electric conductor.

2. The high frequency antenna of a high frequency plasma generator according to claim 1, wherein the supporting tube structure and the electric conductor arranged in it are in the form of a coil.

3. The high frequency antenna of a high frequency plasma generator according to claim 1, wherein the tube structure has a serpentine-shaped or comb-shaped or grid-shaped configuration.

4. The high frequency antenna of a high frequency plasma generator according to claim 1, wherein the tube structure is made of glass.

5. The high frequency antenna of a high frequency plasma generator according to claim 1, further comprising a device for supplying a coolant through the tube structure.

6. High frequency ion source for the production of positive or negative ions comprising a self-supporting insulated electric conductor arrangement having an electric conductor and insulation surrounding said conductor, whereby said insulation comprises a tube structure of insulating material and provides the supporting structure for the conductor arrangement contained therein.

7. The high frequency antenna of a high frequency plasma generator according to claim 1, wherein the tube structure is made of quartz glass.

* * * * *